United States Patent [19]
Bergsten et al.

[11] Patent Number: 5,483,681
[45] Date of Patent: Jan. 9, 1996

[54] APPARATUS FOR COMPENSATING OF PHASE ROTATION IN A FINAL AMPLIFIER STAGE

[75] Inventors: Pär S. T. Bergsten, Solna; Jan-Christian Nyström, Sollentuna, both of Sweden

[73] Assignee: Telefonaktiebolaget LM Ericsson, Stockholm, Sweden

[21] Appl. No.: 110,944

[22] Filed: Aug. 24, 1993

[30] Foreign Application Priority Data

Aug. 24, 1992 [SE] Sweden .................................. 9202420

[51] Int. Cl.⁶ ................................ H04B 1/04; H03F 1/32
[52] U.S. Cl. .......................... 455/126; 455/127; 330/109; 330/149
[58] Field of Search ..................................... 455/119, 126, 455/127; 330/107, 109, 149; 375/39, 60, 261, 296

[56] References Cited

U.S. PATENT DOCUMENTS

| | | |
|---|---|---|
| 4,291,277 | 9/1981 | Davis et al. . |
| 4,462,001 | 7/1984 | Girard . |
| 5,066,922 | 11/1991 | Leitch ................................. 455/126 X |
| 5,175,879 | 12/1992 | Ellingson et al. ...................... 455/126 |

FOREIGN PATENT DOCUMENTS

WO91/06149  5/1991  WIPO .

*Primary Examiner*—Chi H. Pham
*Attorney, Agent, or Firm*—Burns, Doane, Swecker & Mathis

[57] ABSTRACT

An apparatus for compensating the phase rotation in the feedback loop of a cartesian feedback power amplifier in a final transmitter stage for quadrature modulation of the complex difference signal between a complex input signal and the corresponding complex feedback signal with a complex modulation signal for forming a modulated real valued first signal and for quadrature modulation of the output signal from the power amplifier with a complex demodulation signal for forming the complex feedback signal. The phase shift between the first signal and the second signal and between the quadrature component of the first signal and the second signal is detected for determining the phase rotation of the feedback loop. Furthermore, the phase rotation of the complex modulation signal can be changed with a compensating phase rotation defined by the determined phase rotation.

12 Claims, 5 Drawing Sheets

APPARATUS FOR COMPENSATING OF PHASE ROTATION IN A FINAL AMPLIFIER STAGE

TECHNICAL FIELD

The present invention relates to an apparatus for compensating the phase rotation in a feedback loop of a cartesian feedback power amplifier in a final transmitter stage by utilizing incoming and feedback quadrature signals.

PRIOR ART

In cartesian feedback the incoming quadrature signals I and Q are compared to feedback quadrature signals. In order to obtain a stable feedback system it is required that the feedback quadrature re signals are approximately in phase with the incoming quadrature re signals when the feedback loop is closed. Due to the phase rotation generated by the feedback loop this condition is not always fulfilled. Therefore, the incoming and feedback quadrature signals are usually brought into phase with each other with the aid of a compensating phase rotation in the feedback loop. A common method to determine the phase rotation generated by the feedback loop is to open the loop and to measure the incoming quadrature signals I, Q and the feedback quadrature signals, whereafter the measured values are A/D-converted, the phase error is calculated and a voltage controlled phase rotator is regulated after a D/A-conversion. In addition to A/D-conversion, D/A-conversion, computer calculation this method also requires electrical circuits to open and close the feedback loop.

SUMMARY OF THE INVENTION

An object of the present invention is to provide an apparatus in which the phase rotation of the feedback loop can be measured and regulated and which can be easily implemented both in analog and digital form, preferably as a function in an integrated circuit.

In an apparatus for compensating phase rotation in the feedback loop of a cartesian feedback power amplifier in a final transmitter stage, said apparatus comprising means for quadrature modulation of a complex difference signal between a complex input signal and the corresponding complex feedback signal with a complex modulation signal for forming a modulated real-valued first signal, and means for quadrature modulation of an output signal from said power amplifier depending on a modulated real-valued second signal with a complex demodulation signal for forming said complex feedback signal, the above object is achieved by means for detecting a measure of the phase shift between said first signal and said second signal and between the quadrature component of said first/second signal and said second/first signal, for determining a measure of the phase rotation of said feedback loop, and means for phase rotation of one of said complex modulation, demodulation, difference and feedback signal with a phase rotation compensating said determined phase rotation.

A further solution comprises means for detecting a measure of the phase rotation between said complex difference signal and said complex feedback signal and means for phase rotation of one of said complex modulation, demodulation, and feedback signals with a phase rotation compensating said determined phase rotation.

SHORT DESCRIPTION OF THE DRAWINGS

The present invention, further objects and advantages obtained by the invention will be best understood with reference to the following specification and the enclosed drawing, in which.

PREFERRED EMBODIMENT

Figure 1:
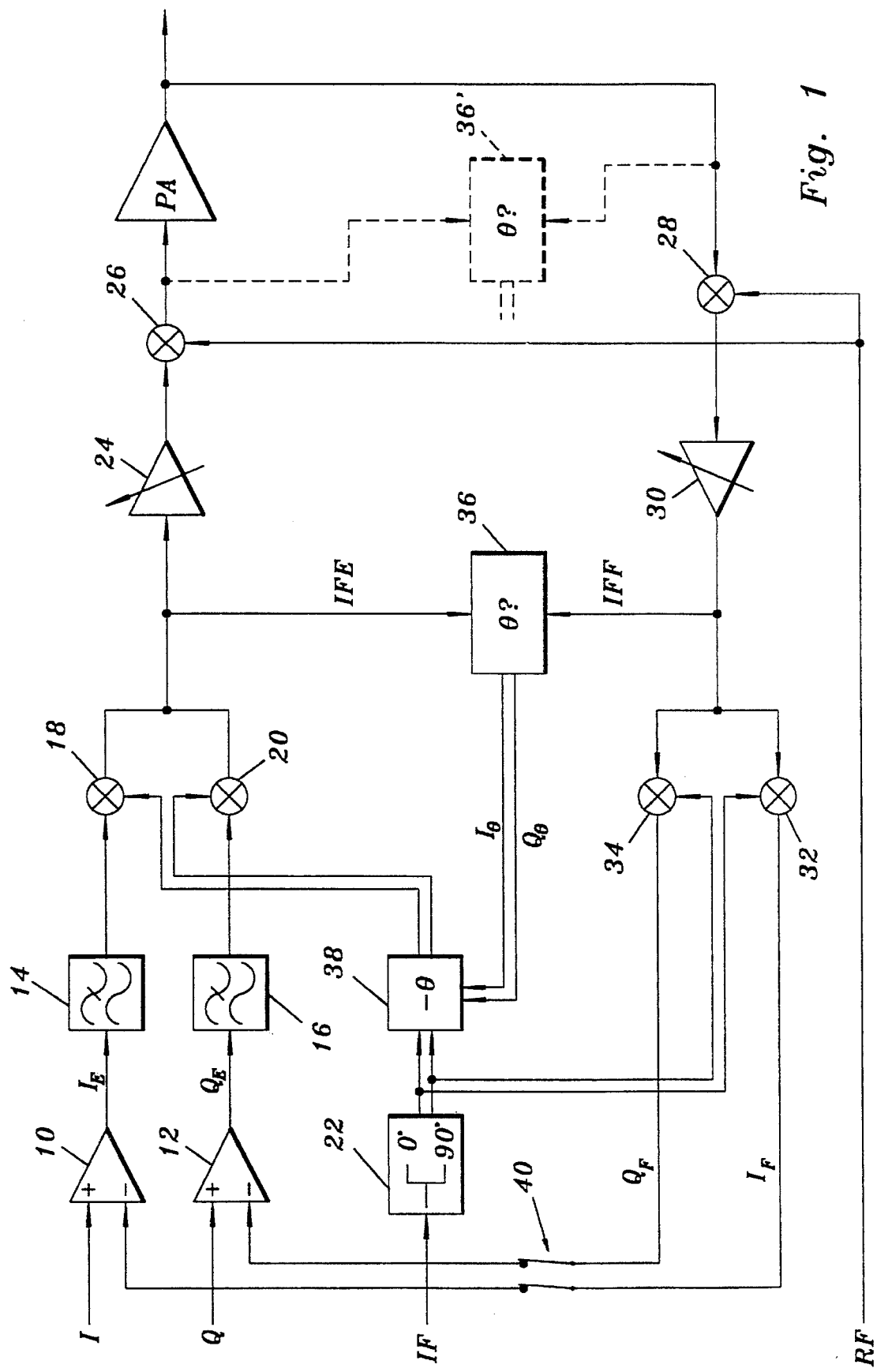
FIG. 1 shows a cartesian feedback final stage in a radio transmitter provided with a preferred embodiment of an apparatus in accordance with the present invention for compensating the phase rotation generated in the feedback loop of the final stage.

FIG. 1 shows a cartesian feedback final stage in a radio transmitter. In order to facilitate the description elements 36, 38 and 40 are initially ignored.

Quadrature signals I and Q are forwarded to comparators 10 and 12, respectively. The output signals $I_E$, $Q_E$ from comparators 10, 12 over loop filters 14, 16 reach respective multipliers 18 and 20. In multiplier 18 the output signal from loop filter 14 is multiplied by an intermediate frequency signal IF, which for instance can have a frequency on the order of 10–500 MHz. In multiplier 20 the output signal from loop filter 16 is multiplied by an intermediate frequency signal IF which has been shifted 90° in a phase shifter 22. The output signal from multipliers 18, 20 are added and are over a possibly provided gain control 24 forwarded to a multiplier 26, in which a mixing to carrier frequency is performed with a high frequency signal RF, which can have a frequency on the order of 900 MHz. The output signal from multiplier 26 is thereafter forwarded to the power amplifier PA of the final transmitter stage. The output signal from amplifier PA is over a possibly provided filter forwarded to the antenna.

A part of the output signal from amplifier PA is used to form a feedback loop. This part of the output signal from amplifier PA is forwarded to a multiplier 28, in which it is mixed down to intermediate frequency with the high frequency signal RF. Over a second possibly provided gain control 30 this mixed down signal is forwarded to two multipliers 32, 34. In multiplier 32 the mixed down signal is multiplied by the intermediate frequency signal IF to form one feedback quadrature signal $I_F$. In multiplier 34 the mixed down signal is multiplied by the intermediate frequency signal IF phase shifted 90° in phase shifter 22 to form the second feedback quadrature signal $Q_F$. Signals $I_F$, $Q_F$ are returned to the second input of respective comparators 10, 12.

In the circuit described so far, the phase rotation Θ of feedback quadrature signals IF, QF produced by the feedback loop has not been considered. This phase rotation Θ is preferably detected by a phase detector 36 in the intermediate frequency section of the final stage. A suitable method of compensating for the phase rotation Θ is to insert a phase rotator 38 that introduces a compensating phase rotation $-\Theta$ before the modulation in multiplicators 18, 20.

The mixed output signal IFE from multipliers 18, 20 to phase detector 36 is defined as:

$$IFE = I_E \cdot \cos(\omega t) + Q_E \cdot \sin(\omega t)$$

where $\Theta$ is the angular frequency of the intermediate frequency signal IF. The feedback input signal IFF to phase detector 36 is defined as:

$$IFF = I_E \cdot \cos(\omega t + \Theta) + Q_E \cdot \sin(\omega t + \Theta)$$

where $\Theta$ is the phase rotation that is to be determined.

In order to calculate the phase rotation $\Theta$, the quadrature signal to signal IFE is formed in phase detector 36. This signal can be defined as:

$$IFEQ = -I_E \cdot \sin(\omega t) + Q_E \cdot \cos(\omega t)$$

Thereafter each of signals IFE, IFEQ is multiplied by signal IFF in phase detector 36. For IFE.IFF one obtains:

$$\begin{aligned}
IFE \times IFF &= \{I_E \times \cos(\omega t) + Q_E \times \sin(\omega t)\} \times \\
&\quad \{I_E \times \cos(\omega t + \Theta) + Q_E \times \sin(\omega t + \Theta)\} \\
&= I_E^2 \times \cos(\omega t + \Theta)\cos(\omega t) + Q_E^2 \times \\
&\quad \sin(\omega t + \Theta)\sin(\omega t) + I_E Q_E \times \\
&\quad \sin(\omega t + \Theta)\cos(\omega t) + \\
&\quad I_E Q_E \times \cos(\omega t + \Theta)\sin(\omega t) \\
&= \tfrac{1}{2}I_E^2 \times \{\cos(2\omega t + \Theta) + \cos(\Theta)\} - \\
&\quad \tfrac{1}{2}Q_E^2 \times \{\cos(2\omega t + \Theta) - \cos(\Theta)\} + \\
&\quad \tfrac{1}{2}I_E Q_E \times \{\sin(2\omega t + \Theta) + \sin(\Theta)\} + \\
&\quad \tfrac{1}{2}I_E Q_E \times \{\sin(2\omega t + \Theta) - \sin(\Theta)\} \\
&= \tfrac{1}{2}(I_E^2 + Q_E^2) \times \cos(\Theta) + \tfrac{1}{2}(I_E^2 - Q_E^2) \times \\
&\quad \cos(2\omega t + \Theta) + \tfrac{1}{2}I_E Q_E \times \sin(2\omega t + \Theta)
\end{aligned}$$

In a similar way one obtains IFEQ.IFF:

$$\begin{aligned}
IFEQ \times IFF &= \{-I_E \times \sin(\omega t) + Q_E \times \cos(\omega t)\} \times \\
&\quad \{I_E \times \cos(\omega t + \Theta) + Q_E \times \sin(\omega t + \Theta)\} \\
&= -I_E^2 \times \cos(\omega t + \Theta)\sin(\omega t) + Q_E^2 \times \\
&\quad \sin(\omega t + \Theta)\cos(\omega t) + -I_E Q_E \times \\
&\quad \sin(\omega t + \Theta)\sin(\omega t) + \\
&\quad I_E Q_E \times \cos(\omega t + \Theta)\cos(\omega t) \\
&= -\tfrac{1}{2}I_E^2 \times \{\sin(2\omega t + \Theta) - \sin(\Theta)\} + \\
&\quad \tfrac{1}{2}Q_E^2 \times \{\sin(2\omega t + \Theta) + \sin(\Theta)\} + \\
&\quad \tfrac{1}{2}I_E Q_E \times \{\cos(2\omega t + \Theta) - \cos(\Theta)\} + \\
&\quad \tfrac{1}{2}I_E Q_E \times \{\cos(2\omega t + \Theta) + \cos(\Theta)\} \\
&= \tfrac{1}{2}(I_E^2 + Q_E^2) \times \sin(\Theta) - \tfrac{1}{2}(I_E^2 - Q_E^2) \times \\
&\quad \sin(2\omega t + \Theta) + \tfrac{1}{2}I_E Q_E \times \cos(2\omega t + \Theta)
\end{aligned}$$

By lowpass filtering these two signals the t-dependent terms are eliminated and only the DC-components remain. These are:

$$I_\Theta = \tfrac{1}{2}(I_E^2 + Q_E^2) \cdot \cos(\Theta)$$

$$Q_\Theta = \tfrac{1}{2}(I_E^2 + Q_E^2) \cdot \sin(\Theta)$$

$I_\Theta$, $Q_\Theta$ determine the phase error (through the equation: $\tan^{-1}(Q_\Theta/I_\Theta)$). The calculated phase rotation, represented by $I_\Theta$, $Q_\Theta$, is used in phase rotator 38 for complex phase rotation of the output signals from phase separator 22 with a phase angle minus $\Theta$. This principle is called feed-forward.

An embodiment of phase detector 36 and phase rotator 38 will now be described in detail with reference to FIG. 2.

Figure 2:
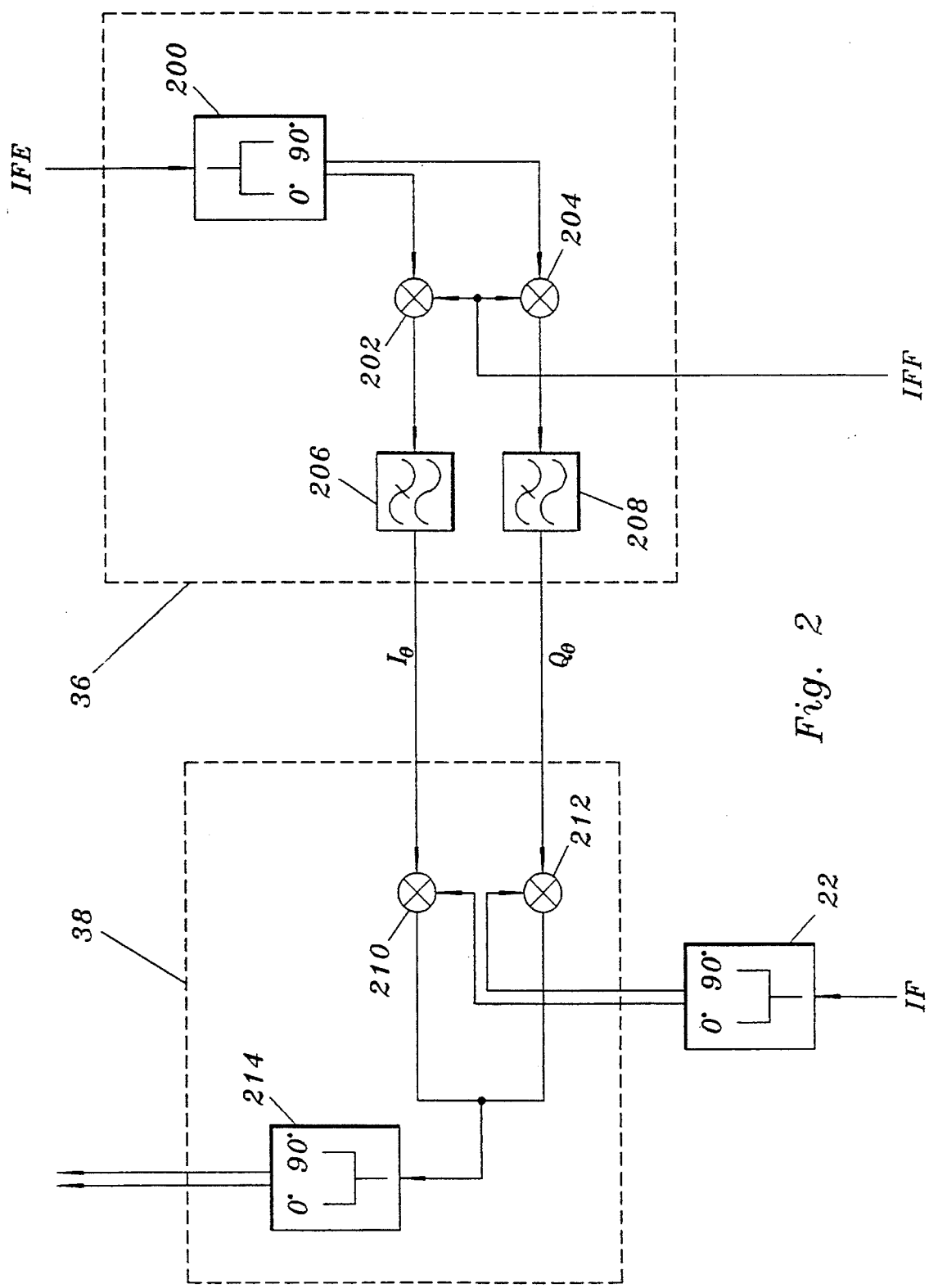
FIG. 2 shows a more detailed block diagram of the phase detector and phase rotator in FIG. 1.

In the embodiment illustrated in FIG. 2 signal IFE is forwarded to a phase separator 200, for instance, a Hilbert-filter. In analog multipliers 202, 204 the separated signals are multiplied by signal IFF. The product signals are forwarded to respective lowpass filters 206, 208 for forming the phase error vector $I_\Theta$, $Q_\Theta$ in accordance with the above equations. Multipliers 202, 204 can for instance comprise Gilbert-mixers. Error vector $I_\Theta$, $Q_\Theta$ is forwarded to two further analog multipliers 210, 212, for example Gilbert-mixers, in which respective components are multiplied by the output signals from phase separator 22. Thereafter the product signals from multipliers 210, 212 are added, and the sum signal is separated in a further phase separator 214, for instance a Hilbert-filter. The output signal from phase separator 214 forms the phase corrected complex signal to multipliers 18, 20. The operation of the phase detector is such that it can be considered as hard limiting, that is the amplitude information is suppressed, while the phase information is emphasized.

When the system is started, the loop is opened by opening switch 40 (see FIG. 1). Thereafter an initial value for $\Theta$ is determined. During this measuring phase phase rotator 38 receives the initial values $I_\Theta=1$, $Q_\Theta=0$ (other values are also possible, the only condition is that $I_\Theta^2 + Q_\Theta^2 \gg 0$). During this initial phase, the time constants of the phase detector can also be changed, so that the transient phase becomes very short. When the initial value for $\Theta$ has been determined the loop is closed by reclosing switch 40. Thereby, the input signals to phase rotator 38 are changed to the actually detected values. Simultaneously, the time constants of phase detector 36 can return to their normal values. Thereafter, the system operates in a stable mode without requiring reopening of the loop. This procedure is repeated every time transmission is started.

An advantage of the present described embodiment of the invention is that the adjustment time is very short, approximately 50 ns for an accuracy in the phase angle determination of approximately 2 degrees. One reason for this is that $\Theta = \tan^{-1}(Q_\Theta/I_\Theta)$, which gives the correct result also for small values of $Q_\Theta/I_\Theta$. For this reason it is in fact even possible to eliminate the above described starting procedure.

Figure 3:
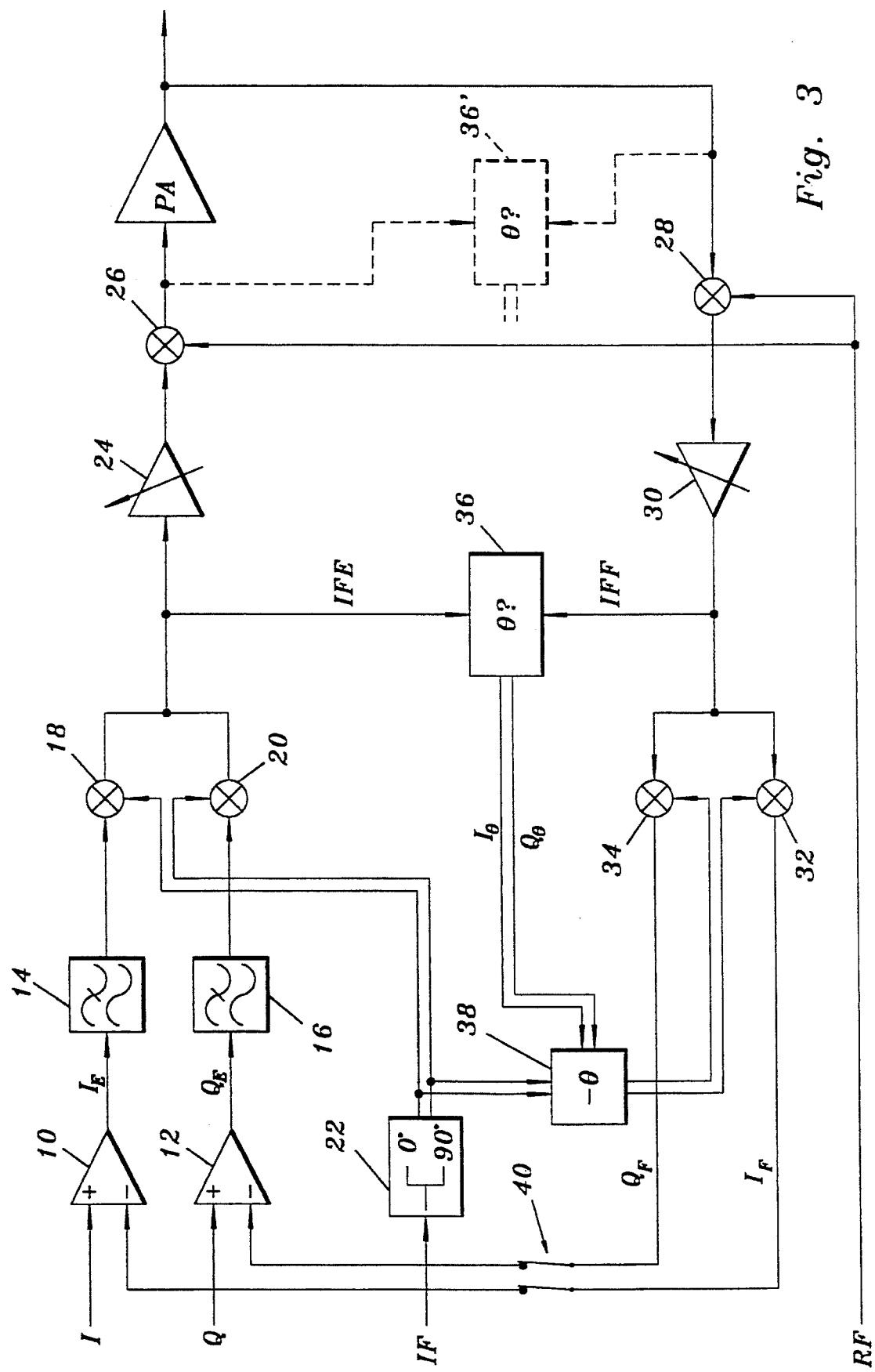
FIG. 3 illustrates a cartesian feedback final stage in a radio transmitter according to one embodiment of the present invention.

A variation of the preferred embodiment comprises a circuit in which phase rotator 38 corrects a complex signal to demodulator 32, 34 instead of the complex signal to modulator 18, 20, as illustrated in FIG. 3. However, a drawback of this variation is among other things that the demodulator is more sensitive to phase errors and noise.

Figure 4:
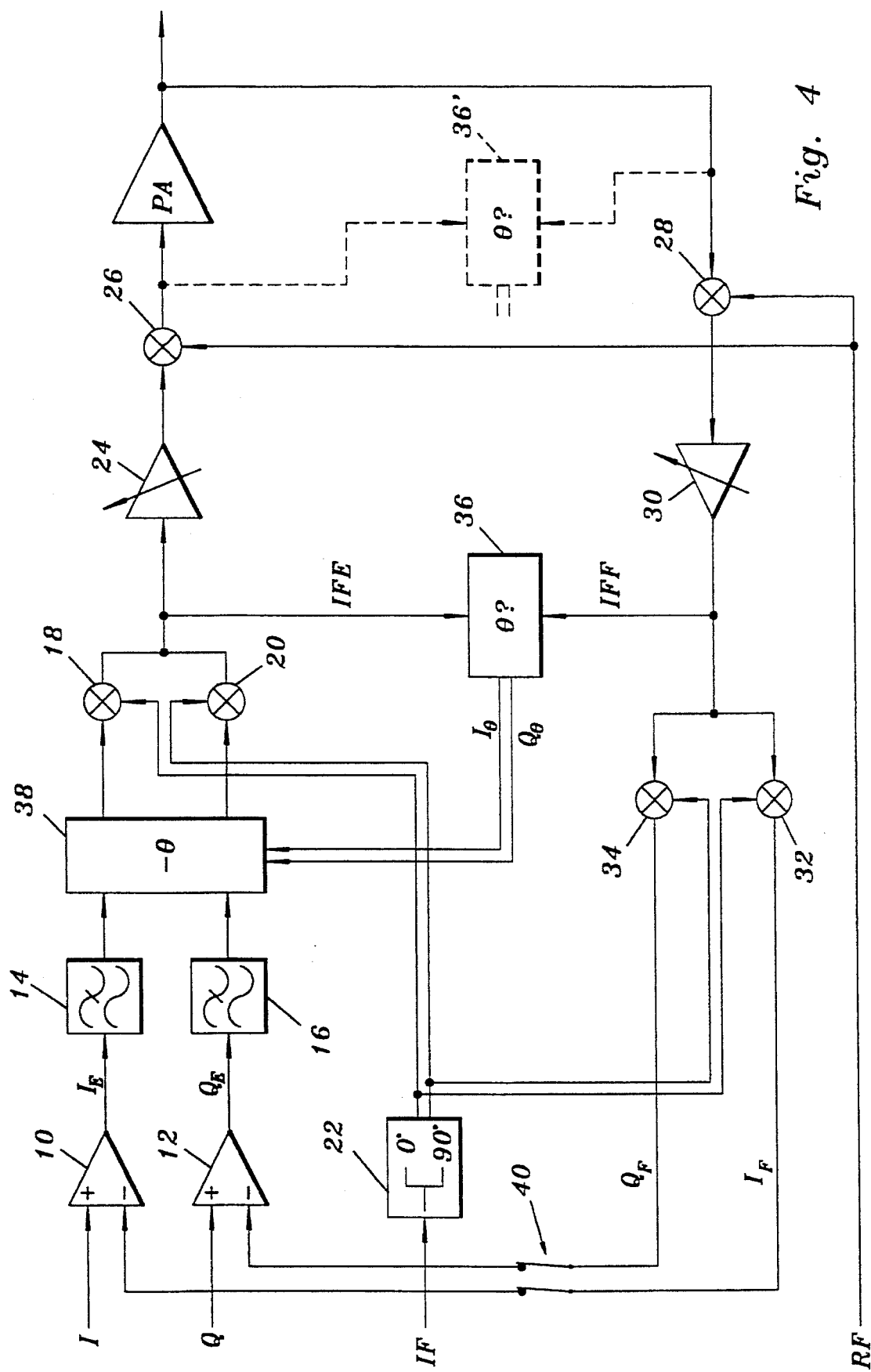
FIG. 4 illustrates a cartesian feedback final stage in a radio transmitter according to one embodiment of the present invention.
Figure 5:
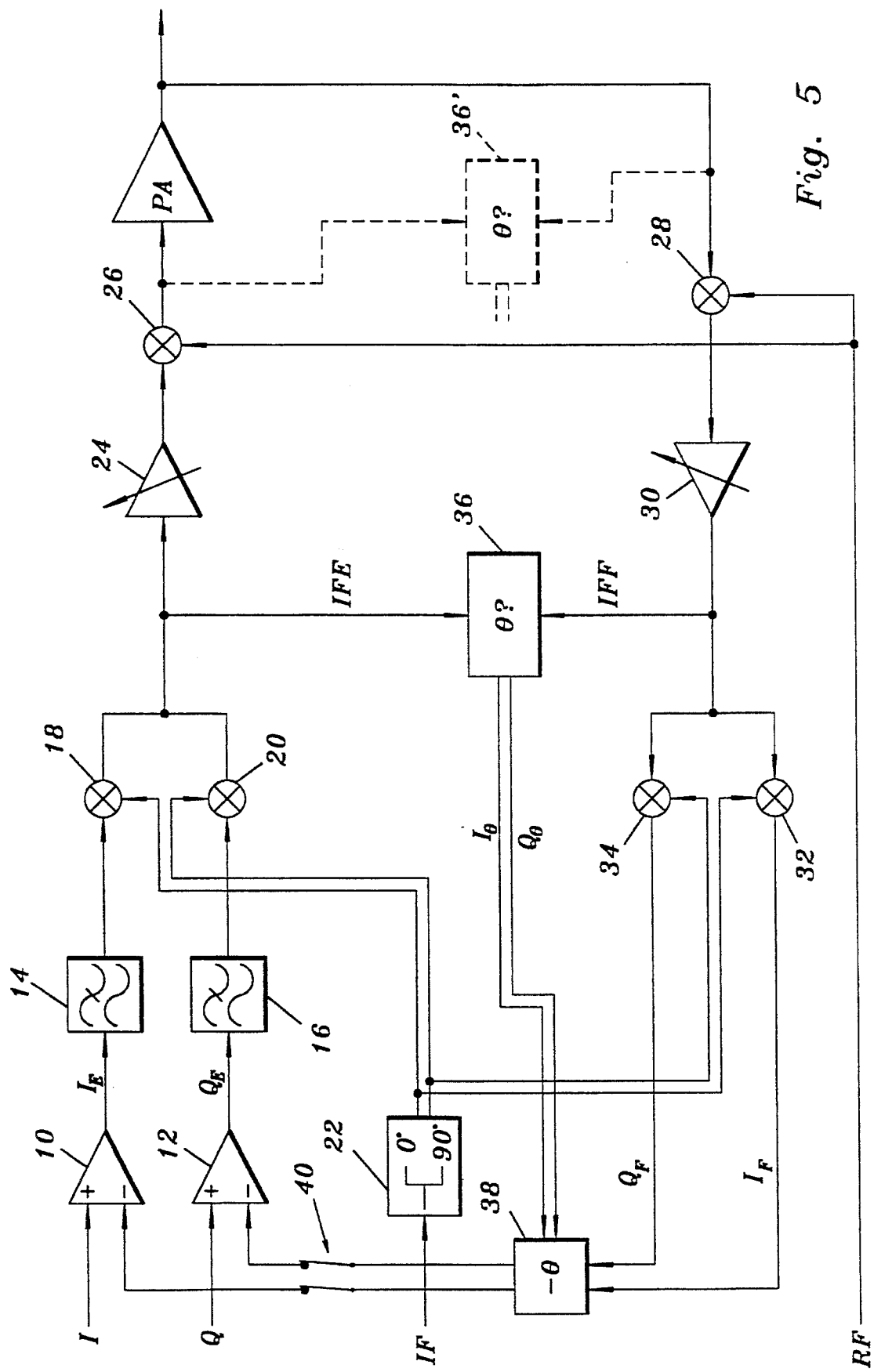
FIG. 5 illustrates a cartesian feedback final stage in a radio transmitter according to another embodiment of the present invention.

Further variations comprise letting phase rotator 38 correct signals $I_E$, $Q_E$ and $I_F$, $Q_F$, respectively, as illustrated in FIGS. 4 and 5. However, this requires a cross connected phase rotator.

A further solution comprises performing both detection and correction on the base band. In such an embodiment the phase rotation between $I_E$, $Q_E$ and $I_F$, $Q_F$ is measured directly on the base band. This is accomplished by complex multiplication of these two signals and lowpass filtering of the complex output signal. The correction can then be performed in the base band with the aid of voltage controlled amplifiers, either directly after the loop filters or at the input of the comparator. A crossconnected phase rotator is required. A drawback of this embodiment, as compared to the preferred embodiment in accordance with FIGS. 1 and 2, is that the adjustment time increases from approximately 50 nanoseconds to a few milliseconds, since the base band signals have significantly lower frequency than signal IF, so that the sum frequencies that are to be filtered away become significantly smaller.

An advantage of the described solutions is that they are suitable for implementation as a function in an integrated circuit.

The man skilled in the art realizes that different modifications and changes of the invention are possible without departure from the scope of the invention, which is defined by the attached patent claims. For instance the invention can be performed in the RF range if no intermediate frequency section is used.

We claim:

1. Apparatus for compensating the phase rotation in the feedback loop of a cartesian feedback power amplifier in a transmitter final stage, comprising means for quadrature modulation of a complex difference signal between a complex input signal and a corresponding complex feedback signal with a complex modulation signal for forming a modulated real valued first signal, means for quadrature demodulation of a real valued second signal, which is derived from an output signal from the power amplifier, and wherein said output signal is derived from said modulated real value first signal with a complex demodulation signal for forming the complex feedback signal, means for detecting a measure of a phase shift between the real valued first signal and the real valued second signal and between a quadrature component of the real valued first signal and the real valued second signal or a quadrature component of the real valued second signal and the real valued first signal, for determining a measure of the phase rotation of the feedback loop, and means for phase rotation of one of said complex modulation, demodulation, difference and feedback signals with a phase rotation compensating said determined phase rotation.

2. The apparatus according to claim 1, wherein said means for phase rotation comprises two analog multipliers for multiplying the real and imaginary part of the measure of the phase shift from said detecting means with a real and imaginary part, respectively, of the modulation signal, and a first Hilbert-filter for separating the sum of the output signals from the multipliers in an I- and a Q-component.

3. The apparatus according to claim 2, wherein said detecting means comprises a second Hilbert-filter for separating the first/second signal in an I- and a Q-component, two analog multipliers for multiplying the I- and Q-components, respectively, with the second/first signal and two lowpass filters for lowpass filtering of the output signals from said multipliers for forming a complex output signal comprising said measure of the phase rotation of the feedback loop.

4. The apparatus in accordance with claim 1, wherein said modulation signal comprises an intermediate frequency signal.

5. The apparatus in accordance with claim 1, wherein said complex modulation signal comprises a high frequency signal.

6. The apparatus in accordance with claim 1, wherein said apparatus is an integrated circuit.

7. Apparatus for compensating the phase rotation in a feedforward manner in a feedback loop of a cartesian feedback power amplifier in a transmitter final stage, comprising means for quadrature modulation of a complex difference signal between a complex input signal and a corresponding complex feedback signal with a complex modulation signal for forming a modulated real valued first signal, means for quadrature demodulation of a modulated real valued second signal, which is derived from an output signal from the power amplifier and wherein said output signal is derived from said modulated real value first signal, with a complex demodulation signal for forming the complex feedback signal, means for detecting a measure of a phase rotation between the complex difference signal and the complex feedback signal, means for phase rotation of one of said complex modulation, demodulation, difference and feedback signals with a phase rotation counteracting said phase rotation in a feedforward manner.

8. The apparatus according to claim 2, wherein said means for phase rotation comprises two analog multipliers for multiplying the real and imaginary part of the measure of the phase shift from said detecting means with a real and imaginary part, respectively, of the modulation signal, and a first Hilbert-filter for separating the sum of the output signals from the multipliers in an I- and a Q-component.

9. The apparatus according to claim 8, wherein said detecting means comprises a second Hilbert-filter for separating the first/second signal in an I- and a Q-component, two analog multipliers for multiplying the I- and Q-components, respectively, with the second/first signal and two lowpass filters for lowpass filtering of the output signals from said multipliers for forming a complex output signal comprising said measure of the phase rotation of the feedback loop.

10. The apparatus in accordance with claim 2, wherein said modulation signal comprises an intermediate frequency signal.

11. The apparatus in accordance with claim 2, wherein said complex modulation signal comprises a high frequency signal.

12. The apparatus in accordance with claim 2, wherein said apparatus is an integrated circuit.

* * * * *